(12) United States Patent
Ogawa et al.

(10) Patent No.: US 6,623,577 B2
(45) Date of Patent: Sep. 23, 2003

(54) ELECTRIC COMPONENT COMPRESSION BONDING MACHINE AND METHOD

(75) Inventors: Yoshitsugu Ogawa, Yokohama (JP); Shinichi Ogimoto, Sagamihara (JP); Kunihiro Iwanaga, Fukuoka (JP)

(73) Assignee: Shibaura Mechatronics Corporation, Yokohama (JP)

( * ) Notice: Subject to any disclaimer, the term of this patent is extended or adjusted under 35 U.S.C. 154(b) by 63 days.

(21) Appl. No.: 10/060,219

(22) Filed: Feb. 1, 2002

(65) Prior Publication Data

US 2002/0117267 A1 Aug. 29, 2002

(30) Foreign Application Priority Data

Feb. 1, 2001 (JP) ...................................... P2001-067793

(51) Int. Cl.$^7$ .................................................. B31F 5/00
(52) U.S. Cl. ...................... 156/64; 156/556; 156/581; 228/49.1
(58) Field of Search .......................... 156/64, 363, 556, 156/580, 581, 583.1; 228/180.22, 185, 49.1

(56) References Cited

U.S. PATENT DOCUMENTS

| 5,106,451 A | * | 4/1992 | Kan et al. ................ 156/583.3 |
| 5,591,295 A | * | 1/1997 | Onitsuka ...................... 156/363 |
| 5,895,554 A | * | 4/1999 | Gordon ........................ 156/556 |
| 6,432,250 B1 | * | 8/2002 | Stupar et al. ................ 156/259 |

* cited by examiner

Primary Examiner—James Sells
(74) Attorney, Agent, or Firm—Oblon, Spivak, McClelland, Maier & Neustadt, P.C.

(57) ABSTRACT

An electric component compression bonding machine for bonding a plurality of electric components arranged in a row to a substrate is described. The bonding machine comprises: a pressure application tool for applying a pressure to the electric components; a pressure receiving tool located opposed to the pressure application tool; a substrate supporting tool for supporting the substrate between the pressure application tool and the pressure receiving tool; a moving unit for moving the substrate supported by the substrate supporting tool relative to the pressure application tool; a control unit connected to the moving unit and taking control of the moving unit in order to adjust the position of the substrate supported by the substrate supporting tool relative to the pressure application tool for compression bonding the electric components to the substrate by the pressure application tool, wherein the control unit controls the moving unit to adjust the position of the substrate supported by the substrate supporting tool relative to the pressure application tool in order that any one of the ends of the pressure application tool is positioned apart from the row of the electric components or positioned between adjacent ones of the electric components.

10 Claims, 8 Drawing Sheets

ELECTRIC COMPONENT COMPRESSION BONDING MACHINE AND METHOD

CROSS REFERENCE TO RELATED APPLICATIONS

This application is based upon and claims the benefit of priority from prior Japanese Patent Application P2001-67793 filed on Feb. 1, 2001; the entire contents of which are incorporated by reference herein.

BACKGROUND OF THE INVENTION

1. Field of the Invention

The present invention relates to an electric component compression bonding machine and method.

2. Description of the Related Art

There have been known, as apparatuses for manufacturing, e.g., flat panel displays such as plasma display panels, electric component mounting machines which are used to mount the electric components composed of, for example, film-type elements and so forth.

Figure 1:
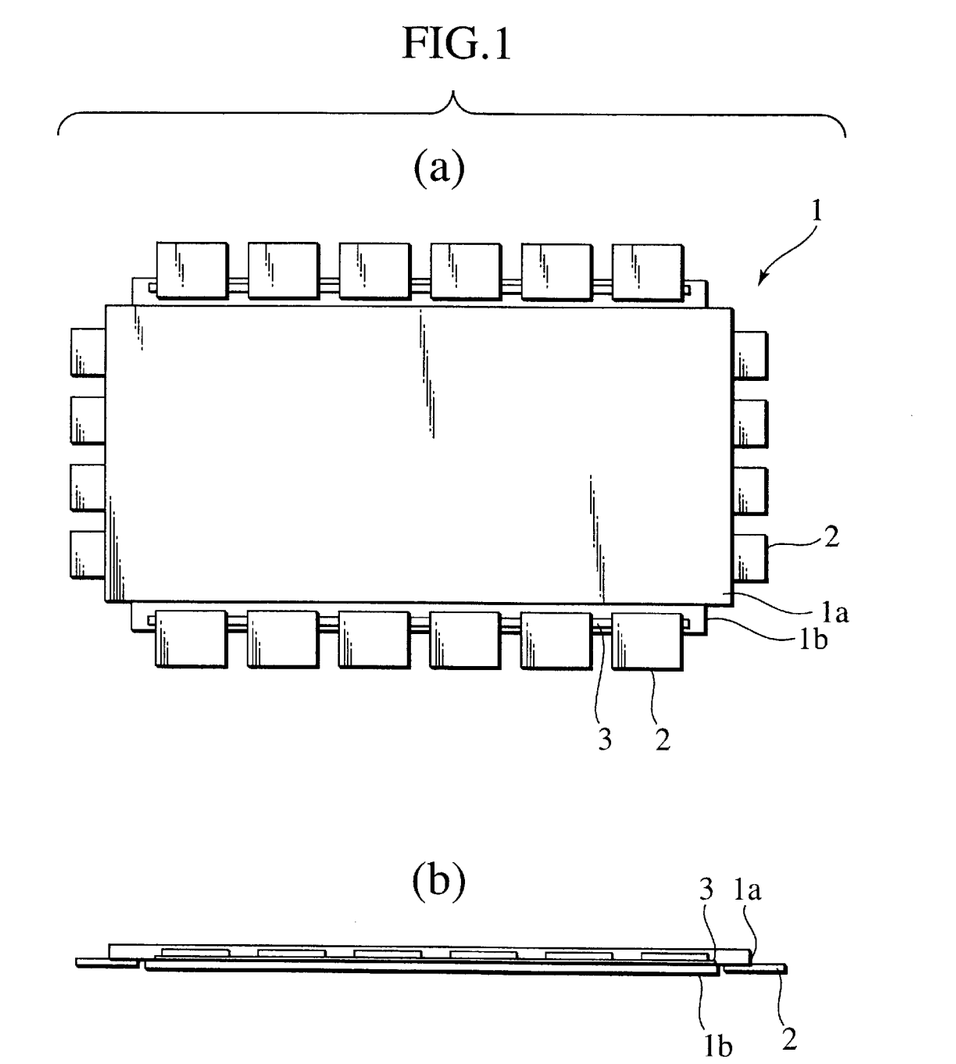

FIG. 1 shows one example of a glass substrate pair on which electric components are mounted by means of an electric component mounting machine, in which FIG. 1(a) is a plan view and FIG. 1(b) is a side view thereof. The glass substrate pair 1 as illustrated in the figure is composed of two substrates 1a and 1b as joined to each other having different dimensions and shapes. On the lower surface of the upper substrate 1a and the upper surface of the lower substrate 1b, a plurality of electric components 2 are mounted along the respective sides of the substrates through anisotropic conductive film 3 (referred to as ACF hereinafter).

Also, in the case of this type of the electric component mounting machine for use in manufacturing glass substrate pairs, the lead electrodes of the electric components 2 are connected to the corresponding lead electrodes of the glass substrate pair 1 by affixing strips of the ACF 3 to the glass substrate pair 1 along the sides where the electric components 2 are to be mounted, temporarily securing the electric components 2 to the glass substrate pair 1 by means of the adhesivity of the ACF 3, and then thermocompression bonding the electric components 2 as temporarily secured to the glass substrate pair 1 by the electric component compression bonding machine.

Figure 2:
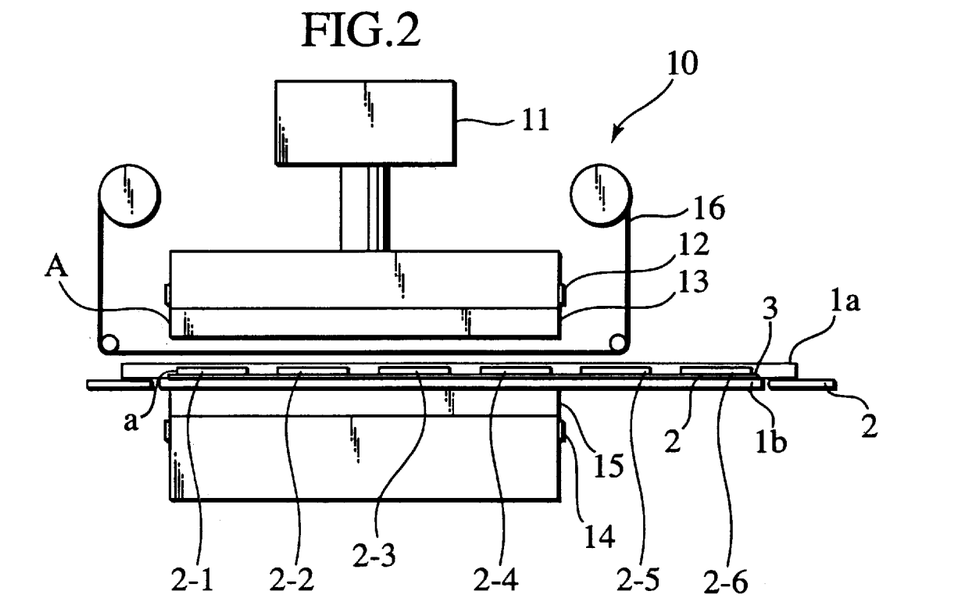
FIG. 2 shows a conventional example of an electric component compression bonding machine.
Figure 3:
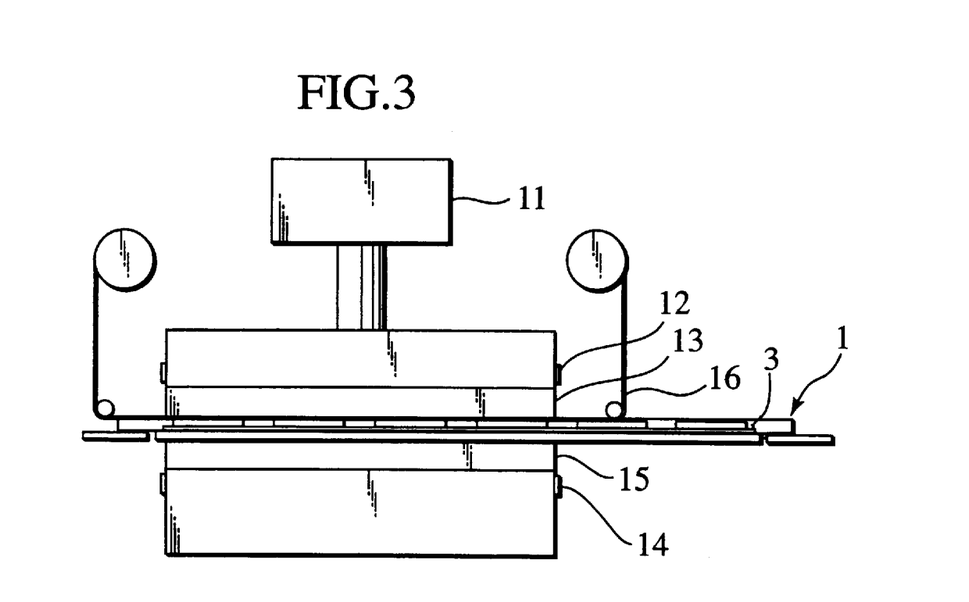
FIG. 3 is a schematic diagram showing the electric component compression bonding machine as illustrated in FIG. 2 during operation.

FIG. 2 shows one example of an electric component compression bonding machine 10. The electric component compression bonding machine 10 as illustrated in FIG. 2 is composed of a pressure application tool 13 in the form of an elongated shape which is moved up and down by means of a pressurized cylinder 11 and provided with an embedded heater 12, a backup tool 15 located opposed to the pressure application tool 13 as a pressure receiving tool which is moved up and down by elevator means (not shown in the figure) and provided with an embedded heater 14, and a sheet member 16 located between the pressure application tool 13 and the backup tool 15. The sheet member 16 is located to intervene between the pressure application tool 13 and the electric components 2 during pressing the electric components 2 with the pressure application tool 13 and serves to absorb the disparity in the flatness of the pressing surface of the pressure application tool 13 in order to make it possible to apply a uniform pressure to the entirety of the area to be presses, and therefore is designed to cover the entirety of the pressing surface of the pressure application tool 13.

The pressure application process is performed by means of the electric component compression bonding machine 10 as follows. At first, the glass substrate pair 1 to which the electric components 2 have been temporarily secured in the previous step is placed on a substrate stage (not shown in the figure) and positioned to the appropriate location where compression bonding is carried out. In the case where the electric component 2-1 is the leftmost electric component among the group of the electric components which are arranged along the side of the glass substrate pair 1 to be pressed at this time, as illustrated in FIG. 2, the positioning is carried out in order that the left end "a" of the electric component 2-1 is aligned to or located slightly inside of the left end "A" of the pressure application tool 13 (more exactly, the left end of the pressure application surface of the pressure application tool 13). Next, the backup tool 15 is moved upward to support the glass substrate pair 1 from the lower position as illustrated in FIG. 2, and thereafter the pressure application tool 13 is moved down by means of the pressurized cylinder 11. By this configuration, as illustrated in FIG. 2, the four electric components 2-1, 2-2, 2-3 and 2-4 located within the span of the pressure application tool 13 are thermocompression bonded to the glass substrate pair 1 at a time through the ACF 3 under the application of pressure by the pressurized cylinder 11 and the application of heat by the heaters 12 and 14.

Figure 4:
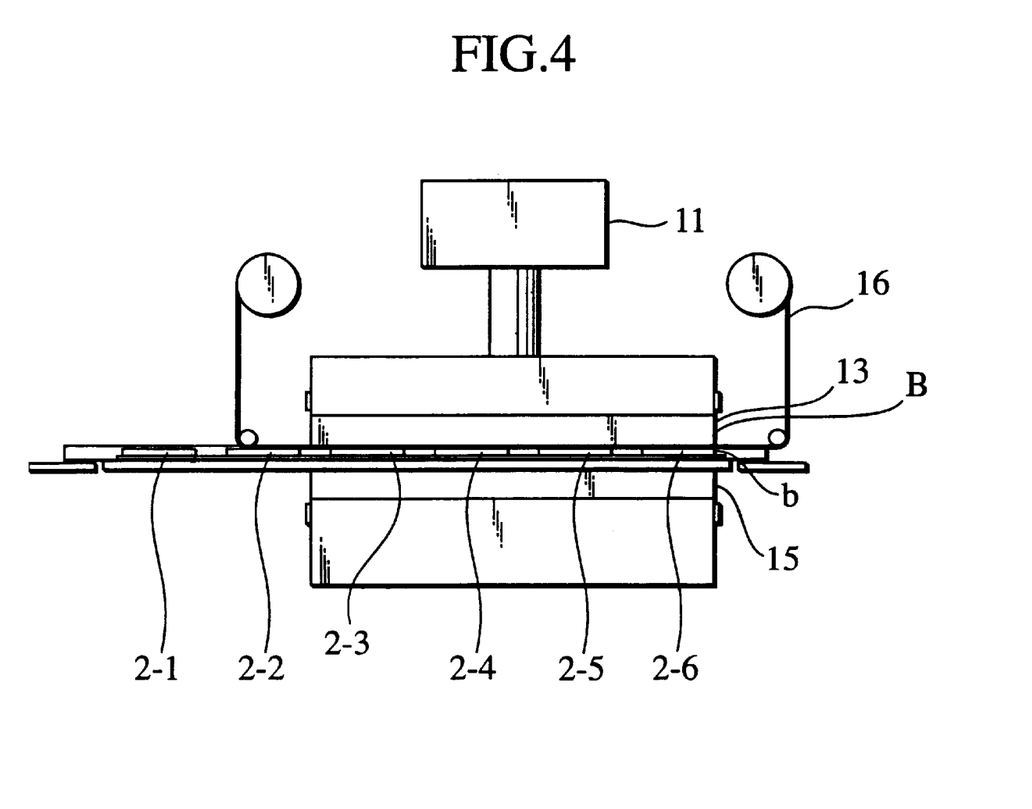
FIG. 4 is a schematic diagram showing the electric component compression bonding machine as illustrated in FIG. 2 during operation.

After the thermocompression bonding of the electric components 2-1 to 2-4 has been completed, the pressure application tool 13 is moved up while the backup tool 15 is moved down. Next, in the case where the electric component 2-6 is the rightmost electric component among the group of the electric components which are arranged along the side of the glass substrate pair 1 to be pressed at this time, as illustrated in FIG. 4, the positioning is carried out in order that the right end "b" of the electric component 2-6 is aligned to or located slightly inside of the right end "B" of the pressure application tool 13 (more exactly, the right end of the pressure application surface of the pressure application tool 13). In the same manner as the previous procedure, after the backup tool 15 is moved up to support the glass substrate pair 1 from the lower position, the pressure application tool 13 is moved down in order to bond the four electric components 2-3, 2-4, 2-5 and 2-6 located within the span of the pressure application tool 13 by thermocompression.

Figure 5:
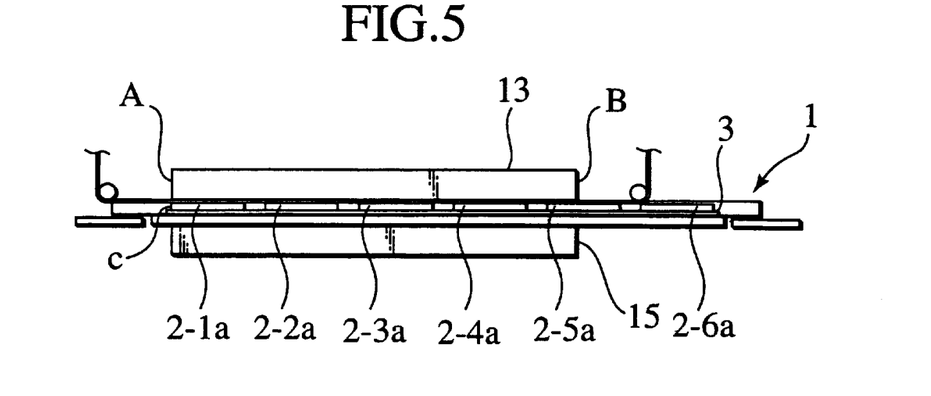
FIG. 5 is a schematic diagram showing the shortcomings of the conventional electric component compression bonding machine.

Meanwhile, when the type of the glass substrate pair 1 to be handled by the electric component compression bonding machine 10 is changed, the dimensions of the glass substrate pair 1 and the electric components 2 will change as well as the intervals between adjacent electric components on the glass substrate pair 1 resulting in the shortcoming as illustrated in FIG. 5. Namely, in the case where the electric component 2-1 is the leftmost electric component among the group of the electric components which are arranged along the side of the glass substrate pair 1 to be pressed at this time. When the left end "c" of the leftmost electric component 2-5a is aligned to or located slightly inside of the left end "A" of the pressure application tool 13, the right end "B" of the pressure application tool 13 is positioned in the middle of the upper surface of the electric component 2-5a so that, as a result, the pressure application surface of the pressure application tool 13 can cover only part of the electric component 2-5a. Accordingly, if the pressure application process were carried out in this condition, the ACF 3 as located under the electric component 2-5a is affected by heat transferred from the pressure application tool 13 or from the backup tool 15 through the electric component 2-6a. Since the ACF 3 is made of a thermoset material, the portion of the ACF 3 as located under the electric component 2-6a but not located just under the pressure application tool 13 is hardened without pressure applied by the pressure application tool 13.

Because of this, even if an amount of heat and a pressure are applied to the portion of the electric component 2-6a having not yet processed in a later step, the lead electrodes of the electric components 2 can not be connected to the lead electrodes of the glass substrate pair 1 since the portion of the ACF 3 as located under the electric component 2-5a has already been hardened as described above. Accordingly, there occurs connection failure in that portion so that the glass substrate pair 1 becomes defective.

The shortcoming can be removed by exchanging the pressure application tool 13 for another one each time when the dimensions of the glass substrate pair 1, the dimensions of the electric components 2, the intervals between adjacent electric components on the glass substrate pair 1 and/or the like are changed. However, this solution is undesirable because it takes much time to replace and adjust the pressure application tool resulting in decreasing the rate of operation of the machine.

BRIEF SUMMARY OF THE INVENTION

In accordance with an aspect of the present invention, the improvement resides in an electric component compression bonding machine for bonding a plurality of electric components to a substrate along a straight line, comprising: a pressure application tool for applying a pressure to said electric components; a pressure receiving tool located opposed to said pressure application tool; a substrate supporting tool for supporting said substrate between said pressure application tool and said pressure receiving tool; a moving unit for moving said substrate supported by said substrate supporting tool relative to said pressure application tool; a parameter setting unit for setting parameters relating to the arrangement of said electric components on said substrate; and a control unit connected to said moving unit and taking control of said moving unit with reference to said parameters as set by said parameter setting unit in order to adjust the position of said substrate supported by said substrate supporting tool relative to said pressure application tool for compression bonding said electric components to said substrate by said pressure application tool, wherein, while said plurality of electric components are divided into groups so that each of said plurality of electric components belongs to one of said groups, said compression bonding is dividedly performed a plurality of times for one after another of said groups in order that there is no electric component which is partially subjected to the pressure before compression bonding.

In accordance with another aspect of the present invention, the improvement resides in an electric component compression bonding machine for bonding a plurality of electric components to a substrate through a buffer element along a straight line, comprising: a pressure application tool for applying a pressure to said electric components; a pressure receiving tool located opposed to said pressure application tool; a substrate supporting tool for supporting said substrate between said pressure application tool and said pressure receiving tool; a buffer element supporting tool for supporting said buffer element between said pressure application tool and said substrate; a moving unit connected to at least one of said pressure application tool and said buffer element supporting tool for moving said pressure application tool relative to said buffer element supporting tool in said straight line; and a control unit for compression bonding said electric components to said substrate by controlling said pressure application tool.

In accordance with a further aspect of the present invention, the improvement resides in an electric component compression bonding method for bonding a plurality of electric components to a substrate along a straight line, comprising: a step of arranging said plurality of electric components along said straight line on said substrate; and a step of moving said substrate relative to said pressure application tool with reference to information about the positional relationship of said plurality of electric components on said substrate in order that said pressure application tool is moved to the position in which said pressure application tool can compression bond, in the vicinity of one end of said pressure application tool, the entirety of one of said electric components located closest to one end of said substrate, in which said pressure application tool can compression bond, in the vicinity of the other end of said pressure application tool, the entirety of one of said electric components located closest to said other end of said pressure application tool and in which the other end of said pressure application tool is located apart from one of said electric components located adjacent to said one of said electric components located closest to said other end of said pressure application tool.

In accordance with a still further aspect of the present invention, the improvement resides in an electric component compression bonding method for bonding a plurality of electric components to a substrate through a buffer element along a straight line, comprising: a step of arranging said plurality of electric components along said straight line on said substrate; and a step of moving said substrate relative to a pressure application tool to a position where said pressure application tool can perform compression bonding the entirety of one of said electric components located closest to one end of said substrate; and a step of moving said buffer element relative to said pressure application tool, before, after or at the same time as said pressure application tool moving step, in order that, during compression bonding, one end of said buffer element is located inside of said one end of said substrate and inside of one end of said pressure application tool close to said one end of said substrate.

In accordance with a still further aspect of the present invention, the improvement resides in an electric component compression bonding machine for bonding a plurality of electric components arranged in a row to a substrate, comprising: a pressure application tool for applying a pressure to said electric components; a pressure receiving tool located opposed to said pressure application tool; a substrate supporting tool for supporting said substrate between said pressure application tool and said pressure receiving tool; a moving unit for moving said substrate supported by said substrate supporting tool relative to said pressure application tool; a control unit connected to said moving unit and taking control of said moving unit in order to adjust the position of said substrate supported by said substrate supporting tool relative to said pressure application tool for compression bonding said electric components to said substrate by said pressure application tool, wherein said control unit controls said moving unit to adjust the position of said substrate supported by said substrate supporting tool relative to said pressure application tool in order that any one of the ends of said pressure application tool is positioned apart from said row of said electric components or positioned between adjacent ones of said electric components.

BRIEF DESCRIPTION OF THE SEVERAL VIEWS OF THE DRAWINGS

The aforementioned and other features and objects of the present invention and the manner of attaining them will become more apparent and the invention itself will be best understood by reference to the following description of various embodiments of the present invention taken in conjunction with the accompanying drawings, wherein:

FIG. 1 shows one example of a glass substrate pair on which electric components are mounted by means of an electric component mounting machine, in which FIG. 1(a) is a plan view and FIG. 1(b) is a side view thereof

DETAILED DESCRIPTION OF THE INVENTION

In the followings, an embodiment of the present invention will be described with reference to the accompanying drawings.

Figure 6:
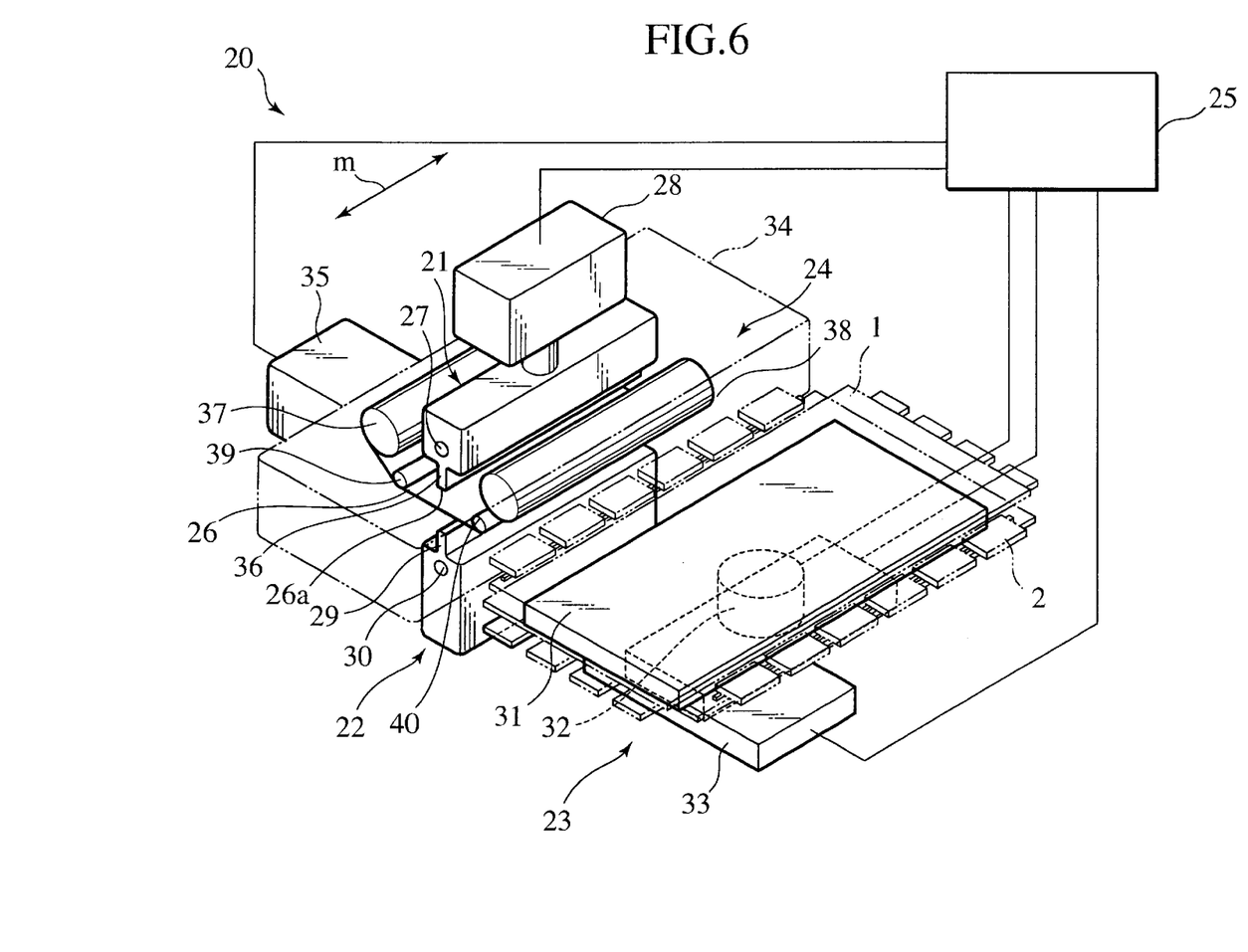
FIG. 6 is a perspective view showing the configuration of an electric component compression bonding machine in accordance with the embodiment of the present invention.
Figure 7:
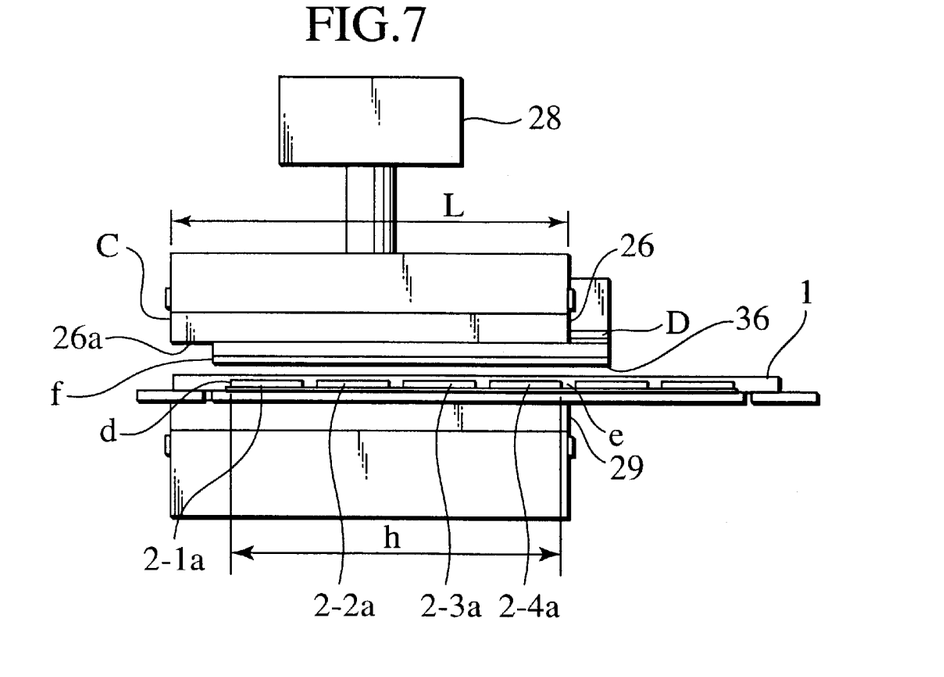
FIG. 7 is a plan view showing the electric component compression bonding machine as illustrated in FIG. 6 during operation.
Figure 8:
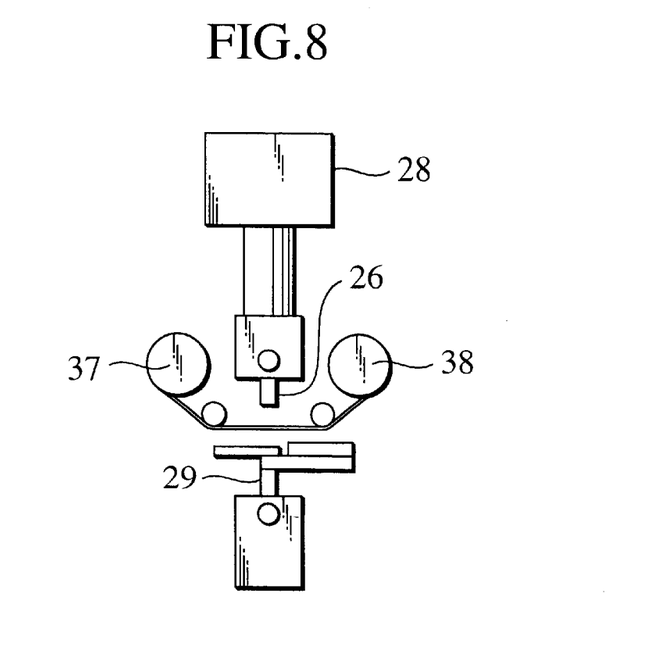
FIG. 8 is a right side view showing the electric component compression bonding machine as illustrated in FIG. 7.
Figure 9:
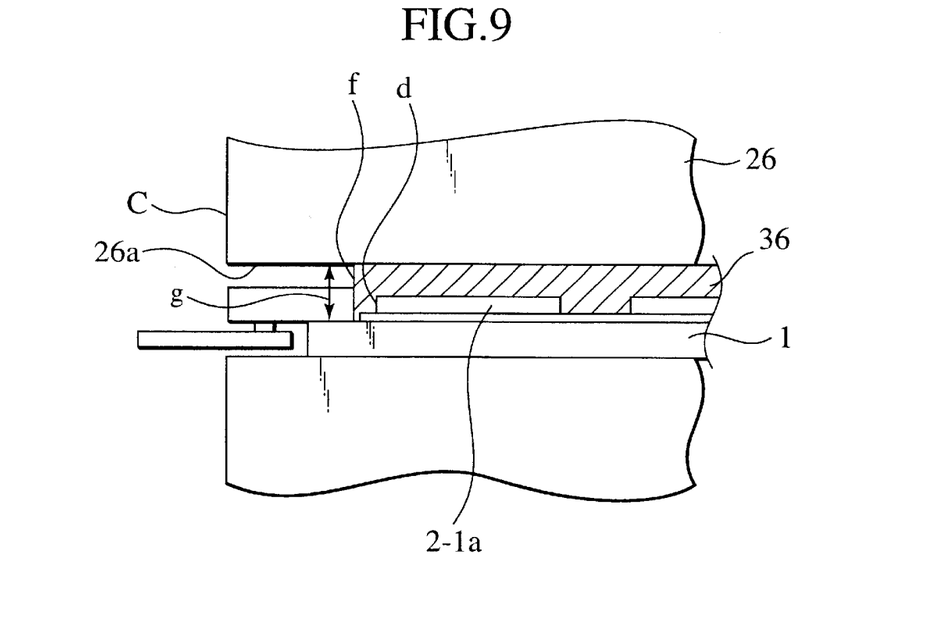
FIG. 9 is a partial expanded front view showing the electric component compression bonding machine during operation.
Figure 10:
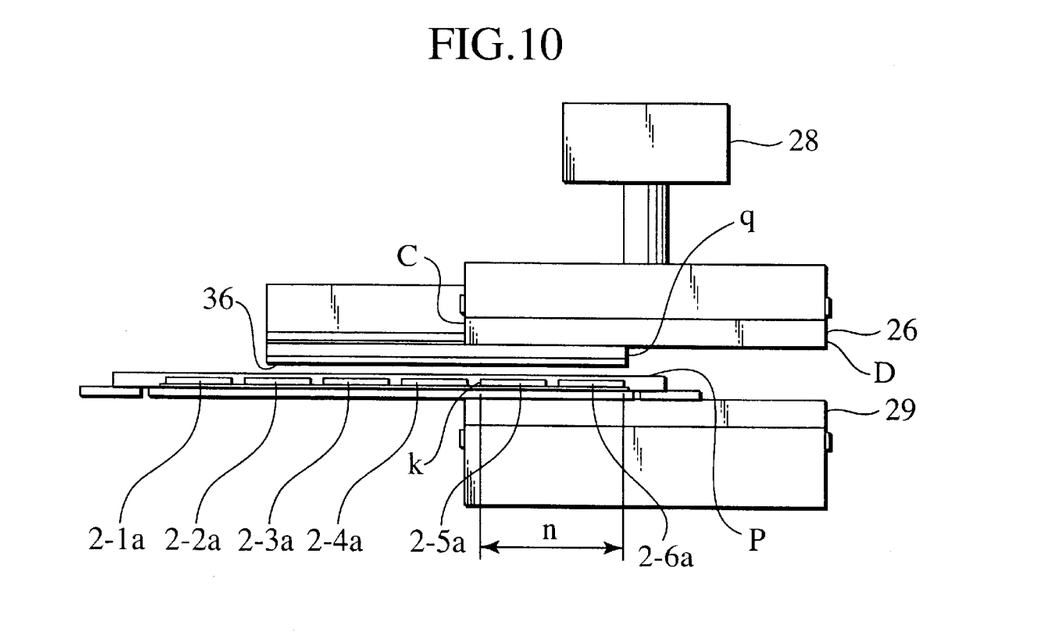
FIG. 10 is a plan view showing the electric component compression bonding machine as illustrated in FIG. 6 during operation in another position different from that as illustrated in FIG. 7.

FIG. 6 is a perspective view showing the configuration of an electric component compression bonding machine in accordance with the embodiment of the present invention; FIG. 7 is a plan view showing the electric component compression bonding machine as illustrated in FIG. 6 during operation; FIG. 8 is a right side view showing the electric component compression bonding machine as illustrated in FIG. 7; FIG. 9 is a partial expanded front view showing the electric component compression bonding machine during operation; and FIG. 10 is a plan view showing the electric component compression bonding machine as illustrated in FIG. 6 during operation in another position different from that as illustrated in FIG. 7.

In this description, the electric component compression bonding machine 20 will be explained in the case where electric components are compression bonded to a plasma display panel. However, it is apparent to those skilled in the art that the electric component compression bonding machine 20 is also used to compression bond electric components to an EL display, field emission displays, a liquid crystal display and so forth in the same manner.

In the FIG. 6, the electric component compression bonding machine 20 is composed of a pressure application head 21, a pressure receiving unit 22, a substrate stage 23, a sheet member supply unit 24 and a control unit 25.

The pressure application head 21 is composed of a pressure application tool 26 in the form of an elongated shape, a heater 27 for heating the pressure application tool 26, a pressurized cylinder 28 for moving up and down the pressure application tool 26. The bottom surface of the pressure application tool 26 serves as a pressure application surface 26a. The pressurized cylinder 28 is fixedly supported by a base structure (not shown in the figure).

The pressure receiving unit 22 is composed of a backup tool 29 as a pressure receiving tool and a heater 30 for heating the backup tool 29. The upper surface of the backup tool 29 is positioned opposed to the pressure application surface 26a of the pressure application tool 26 constituting the pressure application head 21. Meanwhile, the backup tool 29 is designed capable of moving up and down by means of elevator means (not shown in the figure).

The substrate stage 23 is composed of a supporting unit 31, a θ table 32 for rotatably supporting the supporting unit 31, an XY table 33 for supporting the θ table 32 movable in the x and y-directions. The substrate stage 23 is configured to receive a glass substrates pair 1, on which a plurality of the electric components 2 have been temporarily secured in a row, as transported by means of transportation input means (not shown in the figure). The glass substrate pair 1 is then removed and transported to the next stage by means of transportation output means (not shown in the figure) after completing the pressure application process thereof by the electric component compression bonding machine 20.

The electric component 2 is, for example, an insulating substrate on which are formed electrode patterns and electrically connected to the control circuits of a plasma display unit when the plasma display unit is assembled with the plasma display panel having been prepared as described here. Transistors, resistors and/or the like elements may be mounted on the electrode patterns if necessary. The electric components 2 are called generally as FPCs (Flexible Printed Circuits). In the case of other applications to EL displays, field emission displays, liquid crystal displays and so forth, appropriate electric components suitable for the applications are used.

The sheet member supply unit 24 is composed of a holder 34 and a position adjustment unit 35 for moving the holder 34 in the longitudinal direction of the pressure application tool 26 (as depicted with an arrow "m" in FIG. 6). The holder 34 accommodates a sheet member 36 made of a silicone as a buffer element. Namely, the holder 34 is composed of a supply reel 37 for supplying the sheet member 36, a take-up reel 38 for rewinding the sheet member 36 and guide rollers 39 and 40. The supply reel 37 and the take-up reel 38 are driven by a suitable driving device to rotate for supplying the sheet member 36 from the supply reel 37 and rewinding the sheet member 36 through the guide rollers 39 and 40 into the take-up reel 38. The guide roller 39 and the guide roller 40 are located in order that the sheet member 36 is passed through between the pressure application surface of the pressure application tool 26 and the upper surface of the backup tool 29 as opposed thereto. Meanwhile, the width of the sheet member 36 in the "m" direction as illustrated in FIG. 6 is designed appropriately equal to the length of the pressure application tool 26 (see FIG. 7).

Also in this case, during operation, the lead electrodes of the electric components 2 are connected to the lead electrodes of the glass substrate pair 1 by affixing ACF to the glass substrate pair 1 along the sides where the electric components 2 are to be mounted, temporarily securing the electric components 2 to the glass substrate pair 1 by means of the adhesivity of the ACF, and then apply an amount of heat and a pressure to the electric components 2 as temporarily secured to the glass substrate pair 1 by the electric component compression bonding machine. The ACF is made from a thermoset material which is given conductivity under pressure and hardened when heated. However, another suitable film can be used in place of the ACF as long as it possesses a necessary adhesivity. For example, such a film has not necessarily to possess a conductivity as long as the lead electrodes of the electric components 2 can be fixed to and electrically and directly connected to the lead electrodes of the glass substrate pair 1 by applying pressure thereto. Also, it is possible to fix the film with the lead electrodes as bonded by means of ultrasonic waves rather than heat.

The control unit 25 serves to take control of the pressurized cylinder 28, the position adjustment unit 35, the θ table 32, the XY table 33 and so forth and maintain necessary information about the glass substrate pair 1 and the pressure application tool 26 such as the length of the tool and the like. The information about the glass substrate pair 1 includes, for example, the positional relationship of the respective electric components of a plurality of electric components as temporarily mounted on the respective sides of the glass substrate pair 1 (for example, the widths of the respective electric components, the interval of each adjacent electric components), the number of the electric components 2 which can be pressed by a single operation, the order of the positions of the glass substrate pair 1 in which the pressure application process is to be sequentially carried out, and so forth.

Next, the operation of the electric component compression bonding machine 20 will be explained in conjunction with FIG. 7.

In the figure, it is assumed that the number of the electric components 2 mounted on the glass substrate pair 1, the interval between each adjacent ones of the electric components and the length of the pressure application tool are same as those of the prior art electric component compression bonding machine as illustrated in FIG. 5. Also stored in the control unit 25 is, for example, the information about the glass substrate pair 1 that the number of the electric components 2 which can be pressed by a single operation is 4, that the four electric components 2-1a to 2-4a are pressed at a time by the initial step of the pressure application process and that thereafter the two electric components 2-5a and 2-6a are pressed at a time by the next step of the pressure application process.

At first, the glass substrate pair 1 to which the electric components 2 have been temporarily secured in the previous step is mounted on the substrate stage 23 and positioned to the appropriate location where compression bonding is carried out. In this first positioning step, the control unit 25 serves to take control of the substrate stage 23 in order to position the glass substrate pair 1 with reference to the information about the glass substrate pair 1 as supplied and the positioning information of the glass substrate pair 1 as detected by a camera (not shown in the figure) provided in the vicinity of the backup tool 29. Namely, while the six electric components 2-1a to 2-6a are arranged along the side of the glass substrate pair 1 to be pressed at this time and four electric components can be pressed by a single operation as described above, one electric components is determined which is the fourth electric component (the electric component 2-4a in this case) from the electric component located at the end of the arrangement. The position of the substrate stage 23 is controlled in order that the opposite side "e" of the fourth electric component 2-4a (the right side in the case of the arrangement as illustrated in FIG. 7, as also called the outer side hereinbelow) as opposed to the side toward the electric component 2-1a is aligned to or located slightly inside of the corresponding end D of the pressure application surface 26a of the pressure application tool 26 (the right end in FIG. 7). In this case, as illustrated in FIG. 7, the span "h" of the arrangement of the electric components 2-1a to 2-4a which can be pressed by a single operation, i.e., the span of the pressure application as required is shorter than the length L of the pressure application tool 26 so that the left end C of the pressure application tool 26 extends beyond the span over the end of the glass substrate pair 1.

Meanwhile, in this positional relationship between the pressure application tool 26 and the glass substrate pair 1, the control unit 25 then takes control of the position adjustment unit 35 for moving the holder 34 and adjusting the relative position of the sheet member 36 to the glass substrate pair 1 in order that the edge "f" (the left edge in FIG. 7) of the sheet member 36 close to the electric component 2-1a as located below the pressure application surface 26a of the pressure application tool 26 is aligned to or located slightly extending beyond the left side "d" (the left side in FIG. 7) of the electric component 2-1a. The positioning of the sheet member 36 relative to the pressure application tool 26 may be performed before or at the same time as the positioning of the pressure application tool 26 relative to the glass substrate pair 1.

After completing the positioning as described above, the control unit 25 then takes control of an elevator device (not shown in the figure) to lift up the backup tool 29 in order to support the glass substrate pair 1 from the bottom as illustrated in FIG. 7, while driving the pressurized cylinder 28 in order to move down the pressure application tool 26, so that the pressure application tool 26 applies pressure to the electric components 2 through the sheet member 36 at a time in order to bond the electric component 2-1a to 2-4d to the glass substrate pair 1 by thermocompression.

It is for the following reason that, in the above step, the left edge "f" of the sheet member 36 below the pressure application surface 26a of the pressure application tool 26 has been aligned to or located slightly extending beyond the outer side "d" of the electric component 2-1a by adjusting the relative position of the sheet member 36 to the glass substrate pair 1. Namely, while the left end C of the pressure application tool 26 is extending over the edge of the glass substrate pair 1 during application of pressure, there is a clearance "g" between the upper surface of the left edge of the glass substrate pair 1 and the pressure application surface 26a and the pressure application tool 26 since the left edge "f" of the sheet member 36 below the pressure application surface 26a of the pressure application tool 26 has been aligned to or located only slightly extending beyond the outer side "d" of the electric component 2-1a as illustrated in FIG. 9. If the sheet member 36 were substantially extending to the end of the pressure application surface 26a of the pressure application tool 26, the pressing force of the pressure application tool 26 would be exerted through the sheet member 26 on the left end of the glass substrate pair 1 where no electric component 2 is mounted to damage the glass substrate pair 1. However, in accordance with the present embodiment, the heat and the pressure applied by the pressure application tool 26 is prevented from being exerted on the end of the glass substrate pair 1 to avoid breakage of the glass substrate pair 1.

Also, it is possible to remove the conventional shortcoming that the pressure application tool 13 has to be exchanged each time when the dimensions of the glass substrate pair 1, the dimensions of the electric components 2, the intervals between adjacent electric components on the glass substrate pair 1 and/or the like are changed. Accordingly, it is possible to avoid considerable labors and times as required to replace and adjust the pressure application tool and maintain the rate of operation of the machine.

Returning to FIG. 7, after thermocompression bonding the electric component 2-1a to 2-4a to the glass substrate pair 1, the pressure application tool 26 is moved up while the backup tool 29 is moved down.

Next, as illustrated in FIG. 10, the control unit 25 takes control of the substrate stage 23 by determining one of the remaining two electric components 2-5a and 2-6a (the electric component 2-5a in this case) that is the second electric component from the electric component located at the other end of the arrangement of the six electric components 2-1a to 2-6a than the end as previously discussed, and positioning the second electric component 2-5a in order that the opposite side "k" of the second electric component 2-5a (the left side in the case of the arrangement as illustrated in FIG. 10) is aligned to or located slightly inside of the corresponding end C (the left end in FIG. 10) of the pressure application surface 26a of the pressure application tool 26. At this time, as illustrated in FIG. 10, the span "n" of the arrangement of the electric components 2-5a and 2-6a which are pressed by a single operation, i.e., the span of the pressure application as required is shorter than the length L of the pressure application tool 26 so that the pressure application tool 26 extends beyond the span over the end of the glass substrate pair 1. The control unit 25 then takes control of the position adjustment unit 35, for the reason as described above, in order that the edge "q" (the right edge in FIG. 10) of the sheet member 36 close to the electric component 2-6a is aligned to or located slightly extending beyond the right side "p" (the right side in FIG. 10) of the electric component 2-6a by moving the holder 34 to adjust the relative position of the sheet member 36 to the glass substrate pair 1.

After completing the positioning as described above, the control unit 25 then takes control of the elevator device to lift up the backup tool 29 in order to support the glass substrate pair 1 from the bottom while driving the pressurized cylinder 28 in order to move down the pressure application tool 26 for thermocompression bonding the electric component 2-5a and 2-6d to the glass substrate pair 1.

For one side of the glass substrate pair 1, the pressure application process is completed as detailedly explained in the above. In the case where there are mounted electric components 2 on another side of the glass substrate pair 1 as illustrated, the pressure application process is repeated in the same manner as explained above after positioning the next side of the glass substrate pair 1 in the pressure application site under the pressure application tool 26. Meanwhile, when the pressure application process is repeated for predetermined times with the same portion of the sheet member 36, the sheet member 36 is successively supplied from the supply reel 37 to the take-up reel 38 for feeding a new portion to the pressure application site under the pressure application tool 26.

Namely, while the electric component 2-4a is the last electric component of the arrangement consisting of the electric components 2-1a to 2-4a as arranged along the side of the glass substrate pair 1 to be pressed at this time, the opposite side "e" (which is opposed to the edge of the glass substrate pair 1) of the electric component 2-4a is aligned corresponding to the end D of the pressure application surface 26a of the pressure application tool 26, the other end C of which extends over the end of the glass substrate pair 1, so that even if the span "h" of the pressure application as required is shorter than the length L of the pressure application tool 26 it is possible to apply heat and pressure to the entirety of the electric components 2-1a to 2-4a and therefore to avoid the conventional shortcoming that only part of an electric component is thermocompression bonded with the remainder which is extending from the end of the pressure application tool 26 over the ACF 3 which is undesirably hardened without application of pressure. As a result, it is possible to thermocompression bond the electric components 2 in a better condition.

Also, for example, when the four electric components 2-1a to 2-4a are pressed at a time by the pressure application tool 26 in accordance with the above described embodiment, the left edge "f" of the sheet member 36 below the pressure application surface 26a of the pressure application tool 26 has been aligned to the corresponding position of the left side "d" of the electric component 2-1a so that even if the span "h" of the pressure application as required is shorter than the length L of the pressure application tool 26 it is possible to avoid breakage of the glass substrate pair 1 by pressure applied from the pressure application tool 26 and therefore to thermocompression bond the electric components 2 in a better condition for the reason as described above.

Meanwhile, in the case of the above described embodiment, the sheet member 36 is located to intervene between the pressure application tool 26 and the backup tool 29. However, the sheet member 36 can be dispensed with if the reliability is maintained.

Also, while the sheet member 36 is supplied from the supply reel 37 in the above described embodiment, the implementation is not limited thereto. For example, it is possible to supply the pressure application site over the electric component 2 with a rectangle sheet cut from the sheet member which is supported by a chuck and the like and supplied anew when necessary.

Furthermore, while the control unit 25 receives, as the information about the glass substrate pair 1, the number of the electric components 2 which can be pressed by a single operation of the pressure application tool 26, the order of the positions of the glass substrate pair 1 in which the pressure application process is to be sequentially carried out and so forth in the above description, the implementation is not limited thereto. For example, the control unit 25 is configured to receive the information about the glass substrate pair 1 including the information of the positions of the respective electric components on the glass substrate pair 1 and the dimensions of the respective electric components while the number of the electric components 2 which can be pressed by a single operation is calculated on the basis of the information. More specifically speaking, for example, the length L of the pressure application tool is compared with the width of one electric component of the arrangement of the electric components 2 which is located at the end of the arrangement along the side of the glass substrate pair 1. As a result, if the length L of the pressure application tool is longer, the sum of the width of said one electric component and the width of the adjacent electric component is assigned to the span "h" of the pressure application as required and compared with the length L of the pressure application tool again. This procedure is repeated until the span "h" of the pressure application becomes longer than the length L of the pressure application tool. The number of the electric components of which the widths are summed up in this manner is then decremented by one as the number of the electric components 2 which can be pressed by a single operation. After determining the number of the electric components 2 which can be pressed by a single operation of the pressure application tool 26, the pressure application process is performed in the same manner as described above.

Figure 15:
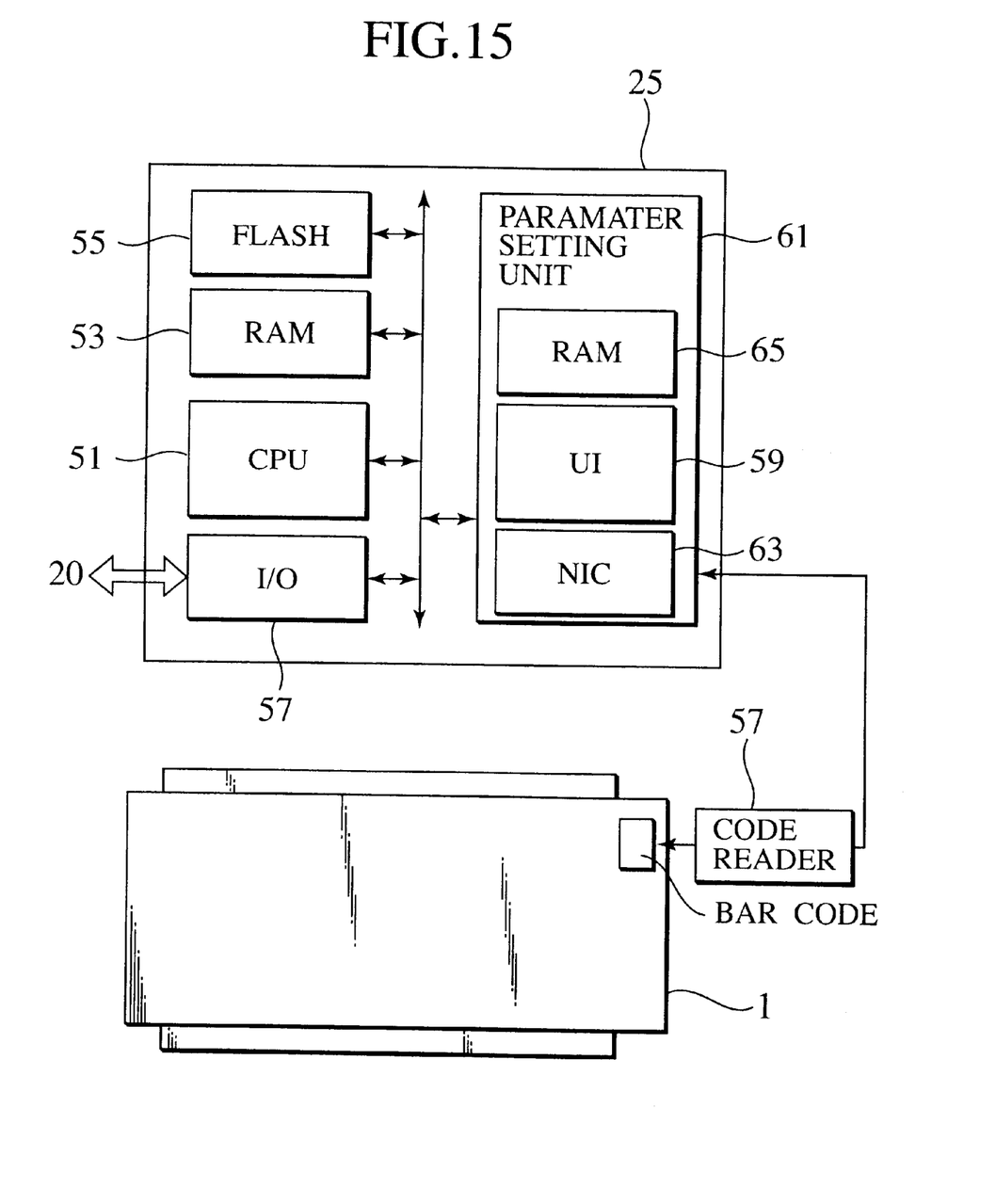
FIG. 15 is a block diagram showing an example of the implementation of the control unit of the electric component compression bonding machine in accordance with the embodiment of the present invention.

Next, an example of the control unit 25 will be explained in details. FIG. 15 is a block diagram showing an example of the implementation of the control unit 25 in accordance with the embodiment of the present invention. The control unit 25 is composed of a CPU 51, a RAM 53, a flash ROM 55, an I/O control unit 57 and a parameter setting unit 61. The CPU 51 serves to run a control program which is loaded to the RAM 53 to take control of the respective elements of the electric component compression bonding machine 20, i.e., the pressure application head 21, the pressure receiving unit 22, the substrate stage 23 and the sheet member supply unit 24 in order to perform the pressure application process as described above. Also, the parameter setting unit 61 includes a user interface 59, a network control unit 63, a ROM 65 and so forth and serves to register parameters as necessary information about the glass substrate pair 1 and the pressure application tool 26 such as the length of the tool and the like in the RAM 53 (or the flash ROM 55). The information is used by the control unit 25 for the purpose of controlling the actual pressure application process.

Next, the steps of setting the parameters as the information about the glass substrate pair 1 by the use of the parameter setting unit 61 will be explained. In the case where the glass substrate pair 1 is provided with a bar code or a two-dimensional code such as a veri code, the parameter setting unit 61 reads out the code by means of a code reader 71 and searches a database stored in the ROM 65 for parameters corresponding thereto, which are then transferred to the RAM 53. In the case where there is available no necessary information in the code provided on the glass substrate pair 1, the parameter setting unit 61 accesses to a server which may provide such information through the network control unit 63, followed by transferring the corresponding parameter to the RAM 53 if obtained.

In the case where there is available no code on the glass substrate pair 1, the parameter setting unit 61 accesses to a predetermined default server through the network control unit 63, followed by transferring the corresponding parameter to the RAM 53 if obtained. In the case where it fails to obtain the necessary parameters from the default server, an operator makes use of the user interface 59 to search and manually access to a server which may provide such information through the network control unit 63. If the necessary parameters are obtained, they are transferred to the RAM 53. If not obtained, the operator has to manually input appropriate parameters to the parameter setting unit 61 through the user interface 59. The parameters as transferred to the RAM 53 are handled by the control program as described above and used for taking appropriate control of the respective elements of the electric component compression bonding machine 20. Alternatively, the operator can input to the parameter setting unit the actual values of movement of the respective elements of the electric component compression bonding machine 20 rather than the parameters as the information of the glass substrate pair 1 as described above.

The foregoing description of the embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated.

For example, while a plurality of electric components are compression bonded at a time in the case of the above described embodiment, the present invention can be applied to the case that the electric components are sequentially compression bonded one after another.

Also, needless to say, the substrate is not limited to a glass substrate pair.

Furthermore, it is possible to apply the present invention to the case where heat application is not indispensible.

Furthermore, while in the initial step all the electric components which can be pressed by a single operation (four electric components in the example) are compression bonded at a time as illustrated in FIG. 7 followed by compression bonding the remaining electric components in the case as illustrated in FIG. 10, it is also possible to compression bond a smaller number of the electric components which can be pressed by a single operation in the initial step. For example, in the case where six electric components are arranged along the side of the glass substrate pair 1 and four electric components can be pressed by a single operation as described above, the electric components are equally divided so that the pressure application process is performed on three electric components for each time.

In the case where it is possible to compression bond all the electric components 2 arranged in one side of the glass substrate pair 1 by a single operation, the positioning is performed by aligning the outer end of the electric component 2 that is located close to either one end of the glass substrate pair 1 along said one side to the corresponding end of the pressure application surface 26a of the pressure application tool 26 and aligning the outer end of the electric component 2 that is located close to the other end of the glass substrate pair 1 along said one side to the corresponding end of the sheet member 36 by relatively moving the sheet member 36.

Furthermore, FIG. 1 through FIG. 14 are schematic diagrams showing other examples of possible combinations of thermocompression positions of the pressure application tool 26 and the orders in which the pressure application tool 26 takes these positions in accordance with the present invention. In the respective figures, the numbers in circle are indicative of the orders of thermocompression while the solid lines are indicative of the positions of the sheet member.

Figure 11:
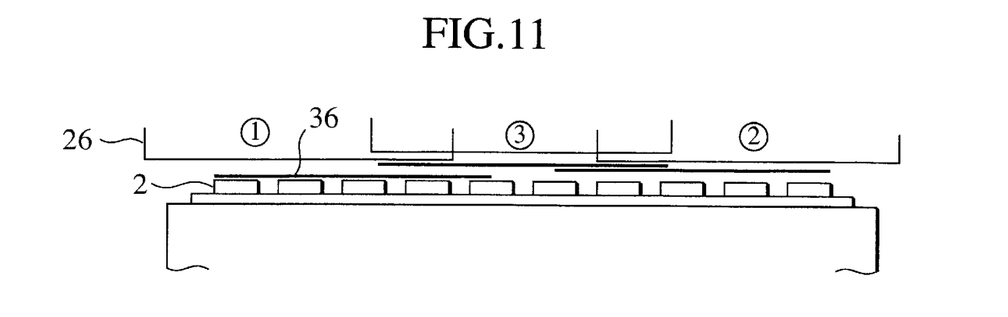
FIG. 11 is a schematic diagram showing another example of a possible combination of thermocompression positions of the pressure application tool and the order in which the pressure application tool takes these positions in accordance with the present invention.

In the case as illustrated in FIG. 11, all the electric components which are arranged from the left and can be pressed by a single operation are compression bonded. Next, all the electric components which are arranged from the right and can be pressed by a single operation are compression bonded. Finally, the remaining electric components 2 are compression bonded. In this case, the right electric components and the left electric components are alternately handled.

Figure 12:
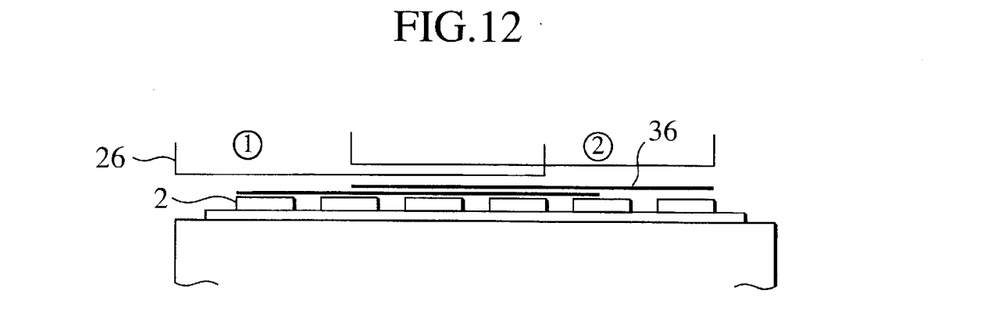
FIG. 12 is a schematic diagram showing a further example of a possible combination of thermocompression positions of the pressure application tool and the order in which the pressure application tool takes these positions in accordance with the present invention.

In the case as illustrated in FIG. 12, all the electric components which are arranged from the left and can be pressed by a single operation are compression bonded. Next, all the electric components which are arranged from the right and can be pressed by a single operation are compression bonded in order that the pressure application tool 26 is not extending to the right beyond the glass substrate pair 1.

Figure 13:
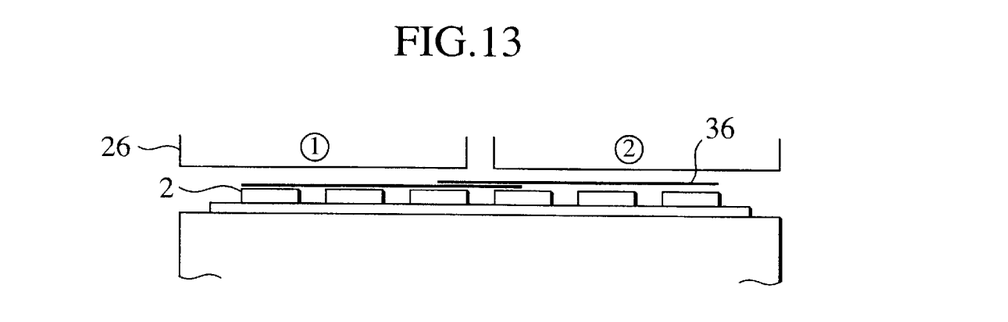
FIG. 13 is a schematic diagram showing a further example of a possible combination of thermocompression positions of the pressure application tool and the order in which the pressure application tool takes these positions in accordance with the present invention.

In the case as illustrated in FIG. 13, all the electric components which are arranged in the side to be handed are equally divided in order to symmetrically perform compression bonding.

Figure 14:
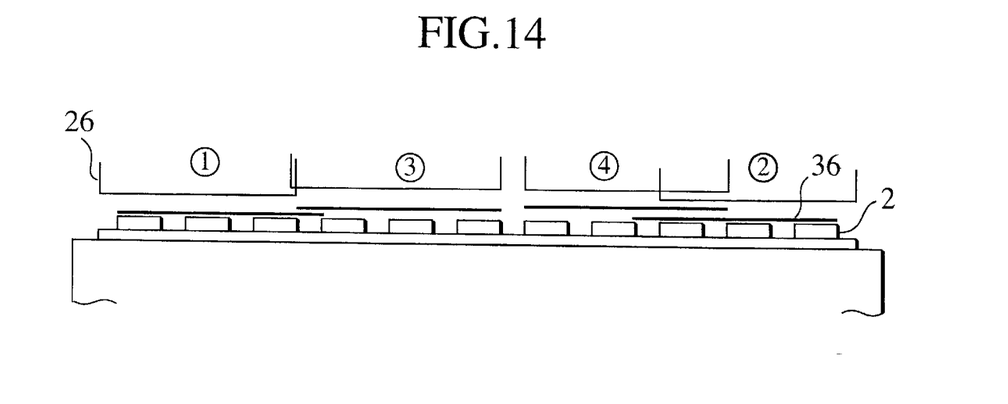
FIG. 14 is a schematic diagram showing a further example of a possible combination of thermocompression positions of the pressure application tool and the order in which the pressure application tool takes these positions in accordance with the present invention.

In the case as illustrated in FIG. 14, the pressure application process is performed in the same manner as illustrated in FIG. 11 while the number of the electric components 2 is substantially large as compared with the length of the pressure application tool 26.

What is claimed is:

1. An electric component compression bonding machine for bonding a plurality of electric components to a substrate along a straight line, comprising:
   a pressure application tool for applying a pressure to said electric components;
   a pressure receiving tool located opposed to said pressure application tool;
   a substrate supporting tool for supporting said substrate between said pressure application tool and said pressure receiving tool;
   a moving unit for moving said substrate supported by said substrate supporting tool relative to said pressure application tool;
   a parameter setting unit for setting parameters relating to the arrangement of said electric components on said substrate; and
   a control unit connected to said moving unit and taking control of said moving unit with reference to said parameters as set by said parameter setting unit in order to adjust the position of said substrate supported by said substrate supporting tool relative to said pressure application tool for compression bonding said electric components to said substrate by said pressure application tool,
   wherein, while said plurality of electric components are divided into groups so that each of said plurality of electric components belongs to one of said groups, said compression bonding is dividedly performed a plurality of times for one after another of said groups in order that there is no electric component which is partially subjected to the pressure before compression bonding.

2. The electric component compression bonding machine as claimed in claim 1 further comprising a parameter setting unit for setting parameters relating to the arrangement of said electric components on said substrate, wherein said control unit takes control of said moving unit with reference to said parameters as set by said parameter setting unit in order to adjust the position of said substrate supported by said substrate supporting tool relative to said pressure application tool for compression bonding said electric components to said substrate by said pressure application tool.

3. The electric component compression bonding machine as claimed in claim 1 wherein said control unit adjusts the position of said substrate supported by said substrate supporting tool relative to said pressure application tool by taking control of said moving unit in order that said pressure application tool is moved to the position in which said pressure application tool can compression bond, in the vicinity of one end of said pressure application tool, the entirety of one of said electric components located closest to one end of said substrate, in which said pressure application tool can compression bond, in the vicinity of the other end of said pressure application tool, the entirety of one of said electric components located closest to said other end of said pressure application tool and in which the other end of said pressure application tool is located apart from one of said electric components located adjacent to said one of said electric components located closest to said other end of said pressure application tool.

4. The electric component compression bonding machine as claimed in claim 1 wherein said parameters to be set by said parameter setting unit include the positional relationship of said plurality of electric components as temporarily mounted on said substrate.

5. The electric component compression bonding machine as claimed in claim 1 wherein said parameters to be set by said parameter setting unit include the respective widths of said plurality of electric components and the interval of each adjacent ones of said electric components.

6. The electric component compression bonding machine as claimed in claim 1 wherein said parameter setting unit is provided with a code reader and obtain said parameters by reading a code provided on said substrate by means of said code reader.

7. An electric component compression bonding machine for bonding a plurality of electric components to a substrate through a buffer element along a straight line, comprising:
   a pressure application tool for applying a pressure to said electric components;
   a pressure receiving tool located opposed to said pressure application tool;
   a substrate supporting tool for supporting said substrate between said pressure application tool and said pressure receiving tool;
   a buffer element supporting tool for supporting said buffer element between said pressure application tool and said substrate;
   a moving unit connected to at least one of said pressure application tool and said buffer element supporting tool for moving said pressure application tool relative to said buffer element supporting tool in said straight line; and
   a control unit for compression bonding said electric components to said substrate by controlling said pressure application tool.

8. An electric component compression bonding method for bonding a plurality of electric components to a substrate along a straight line, comprising:

a step of arranging said plurality of electric components along said straight line on said substrate; and a step of moving said substrate relative to said pressure application tool with reference to information about the positional relationship of said plurality of electric components on said substrate in order that said pressure application tool is moved to the position in which said pressure application tool can compression bond, in the vicinity of one end of said pressure application tool, the entirety of one of said electric components located closest to one end of said substrate, in which said pressure application tool can compression bond, in the vicinity of the other end of said pressure application tool, the entirety of one of said electric components located closest to said other end of said pressure application tool and in which the other end of said pressure application tool is located apart from one of said electric components located adjacent to said one of said electric components located closest to said other end of said pressure application tool.

9. An electric component compression bonding method for bonding a plurality of electric components to a substrate through a buffer element along a straight line, comprising:

a step of arranging said plurality of electric components along said straight line on said substrate; and a step of moving said substrate relative to a pressure application tool to a position where said pressure application tool can perform compression bonding the entirety of one of said electric components located closest to one end of said substrate; and a step of moving said buffer element relative to said pressure application tool, before, after or at the same time as said pressure application tool moving step, in order that, during compression bonding, one end of said buffer element is located inside of said one end of said substrate and inside of one end of said pressure application tool close to said one end of said substrate.

10. An electric component compression bonding machine for bonding a plurality of electric components arranged in a row to a substrate, comprising:

a pressure application tool for applying a pressure to said electric components;

a pressure receiving tool located opposed to said pressure application tool;

a substrate supporting tool for supporting said substrate between said pressure application tool and said pressure receiving tool;

a moving unit for moving said substrate supported by said substrate supporting tool relative to said pressure application tool;

a control unit connected to said moving unit and taking control of said moving unit in order to adjust the position of said substrate supported by said substrate supporting tool relative to said pressure application tool for compression bonding said electric components to said substrate by said pressure application tool, wherein said control unit controls said moving unit to adjust the position of said substrate supported by said substrate supporting tool relative to said pressure application tool in order that any one of the ends of said pressure application tool is positioned apart from said row of said electric components or positioned between adjacent ones of said electric components.

* * * * *